(12) United States Patent
Goh et al.

(10) Patent No.: US 11,699,664 B2
(45) Date of Patent: Jul. 11, 2023

(54) WRAPPABLE EMI SHIELDS

(71) Applicant: Intel Corporation, Santa Clara, CA (US)

(72) Inventors: Eng Huat Goh, Pulau Pinang (MY); Tin Poay Chuah, Pulau Pinang (MY); Yew San Lim, Pulau Pinang (MY); Min Suet Lim, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 261 days.

(21) Appl. No.: 17/089,756

(22) Filed: Nov. 5, 2020

(65) Prior Publication Data
US 2022/0068834 A1 Mar. 3, 2022

(30) Foreign Application Priority Data
Sep. 3, 2020 (MY) .............................. PI2020004580

(51) Int. Cl.
*H01L 23/552* (2006.01)
*H05K 3/28* (2006.01)
*H05K 1/02* (2006.01)

(52) U.S. Cl.
CPC ......... *H01L 23/552* (2013.01); *H05K 1/0209* (2013.01); *H05K 3/284* (2013.01)

(58) Field of Classification Search
CPC ..... H01L 23/552; H05K 1/0209; H05K 3/284

USPC ......................................................... 257/659
See application file for complete search history.

(56) References Cited

U.S. PATENT DOCUMENTS

| | | | |
|---|---|---|---|
| 2003/0155987 A1* | 8/2003 | Kolb ................... | H05K 9/0024 333/181 |
| 2012/0139097 A1* | 6/2012 | Jin ....................... | H01L 21/561 257/E23.18 |
| 2016/0254236 A1* | 9/2016 | Kim .................... | H01L 23/3114 257/659 |
| 2016/0276307 A1* | 9/2016 | Lin ...................... | H01L 23/562 |
| 2018/0168076 A1* | 6/2018 | Chao ................... | H05K 9/0022 |
| 2019/0148337 A1* | 5/2019 | Kim .................... | H04M 1/0277 257/713 |

* cited by examiner

*Primary Examiner* — Nduka E Ojeh
*Assistant Examiner* — Laura M Dykes
(74) *Attorney, Agent, or Firm* — Viering, Jentschura & Partner MBB

(57) ABSTRACT

According to the various aspects, the present device includes a printed circuit board having a top surface and a bottom surface, with a plurality of semiconductor devices coupled to the top surface and a flexible electromagnetic shield wrap conformally positioned over and between the plurality of semiconductor devices and the top surface of the printed circuit board. The flexible electromagnetic shield wrap is conformally positioned by applying a vacuum and is removable after the vacuum seal is broken.

15 Claims, 10 Drawing Sheets

WRAPPABLE EMI SHIELDS

CROSS-REFERENCE TO RELATED APPLICATIONS

This non-provisional application claims priority to Malaysian Patent Application No. PI2020004580, which was filed on Sep. 3, 2020, which is incorporated by reference herein in its entirety.

BACKGROUND

The miniaturization of electronic devices in the form of higher packing density to achieve faster responses, especially in semiconductor devices, has resulted in greater electromagnetic interference (EMI). EMI is the result of unwanted radiated signals (i.e., noise) and the most common cause of EMI is electrostatic discharge (ESD). For semiconductor devices, EMI may lead to unacceptable signal degradation and reduced equipment performance, which may ultimately lead to a severe loss of signal integrity and the unsafe operation of an electronic device. Most semiconductor devices will make use of some form of EMI shielding.

Conformal coatings are employed extensively in semiconductor processes. The principal methodology is spraying, although dipping methods are sometimes used as well. The use of spraying methods may have the typical challenges of managing viscosity, surface tension, curing temperatures that may lead to non-uniformity and dewetting defects at hard to reach areas on a board and may not be suitable for some applications. Conformal coating using dipping methods have constraints since the coating will penetrate beneath every component, hence a masking process may be required. Accordingly, due to the lack of uniformity resulting from common conformal coatings methods, applying a thermal interface material (TIM) directly onto semiconductor components is generally avoided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for the methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

According to the present disclosure, the present device includes a printed circuit board with a plurality of semiconductor devices coupled to its top surface and a flexible electromagnetic shield wrap conformally positioned over and between the plurality of semiconductor devices and on the top surface of the printed circuit board. The flexible electromagnetic shield wrap is air-tight, uniformly thick, conformally positioned by applying a vacuum, and removable after the vacuum seal is broken. The flexible electromagnetic shield wrap may have a single layer consisting of a shield layer made of an electromagnetic energy blocking non-conductive material. The flexible electromagnetic shield wrap may also have two layers consisting of a shield layer made of an electromagnetic energy blocking conductive material and a non-conductive layer made of a softenable material that removably adheres to surfaces.

The technical advantages of the present disclosure include, without limitation: (1) a uniformly thick, flexible electromagnetic shield wrap that can be easily used and removed; and (2) achieving better thermal dissipation with a TIM filling all of the narrow component-to-component gaps for improved multidirectional and uniform heat spreading.

Figure 1:
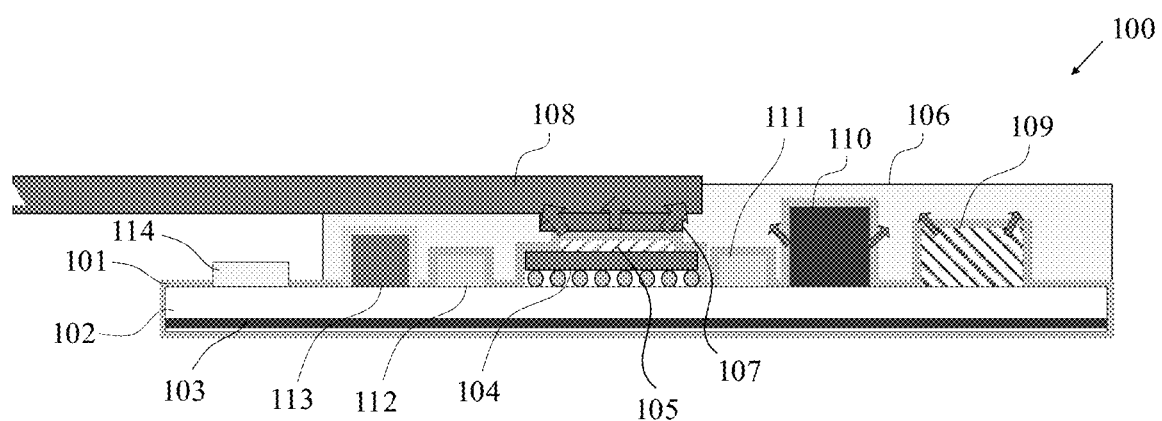
FIG. 1 shows a cross-sectional view of an exemplary motherboard with a conformally positioned flexible electromagnetic shield wrap according to an aspect of the present disclosure.

According to the present disclosure, as shown in a cross-sectional view provided in FIG. 1, a device 100 may have a motherboard 102 with a flexible electromagnetic shield wrap 101 conformally positioned over and between a plurality of semiconductor devices. The flexible electromagnetic shield wrap 101 may be able to block electromagnetic interference (EMI) to provide improved electrical performance. In another aspect, positioning the flexible electromagnetic shield wrap 101 on the bottom surface of motherboard 102 may permit a signal routing line 103 (i.e., a power line) to be placed proximal to the bottom surface. The flexible electromagnetic shield wrap 101 may be a single layer or a dual-layer, as discussed further with respect to FIG. 3 below. In another aspect, the flexible electromagnetic shield wrap 101 may have a thickness in the range of 30-300 um.

In an aspect, the plurality of semiconductor devices may include a semiconductor package 104 (including a central processing unit (CPU) 105), a data storage device 109, an inductor 110, capacitors 111 and 112, a memory device 113 and a plug-in component 114 as shown in FIG. 1. Additional semiconductors within the scope of the present disclosure include a modem, a Retimers, a Redriver, power gates, and other devices. As shown in FIG. 1, the plurality of semiconductor devices may generate heat that may be transferred to a thermal interface material (TIM) 106 and a thermal transfer member or heat pipe 108. The CPU 105 may generate significantly more heat and may have a heat spreader 107 coupling it to the heat pipe 108. The TIM 106, heat spreader 107, and heat pipe 108 work to dissipate the heat generated by the device 100 and may be considered to be parts of a thermal transfer unit.

Figure 2A:
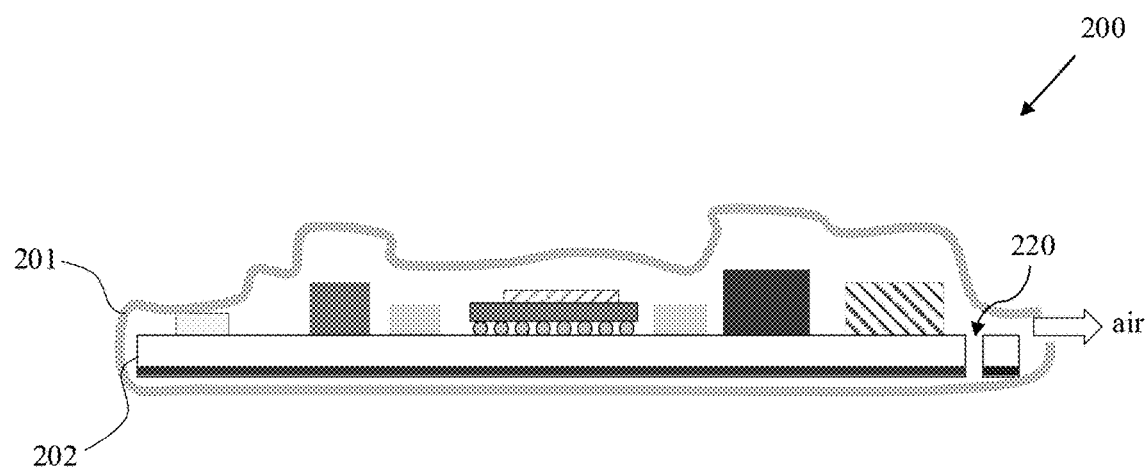
FIG. 2A shows a cross-sectional view of an exemplary motherboard enveloped in a flexible electromagnetic shield wrap according to an aspect of the present disclosure.

FIG. 2A shows a cross-sectional view of a device 200 with an exemplary motherboard 202 enveloped in a flexible electromagnetic shield wrap 201 according to an aspect of the present disclosure. The motherboard 202 may have one or more release aperture 220 positioned on the board, as discussed further in FIG. 2D below. In an aspect, a flexible electromagnetic shield wrap may be formatted for use as a sheet that covers only a top or bottom surface of a motherboard, or as a larger sheet to place a motherboard on top of and foldover to envelop the motherboard. In another aspect, a flexible electromagnetic shield wrap may be formatted for use as a bag that allows a motherboard to be placed inside and sealed.

Figure 2B:
FIG. 2B shows a cross-sectional view of an exemplary motherboard with a conformally positioned flexible electromagnetic shield wrap according to an aspect of the present disclosure.
Figure 2B:
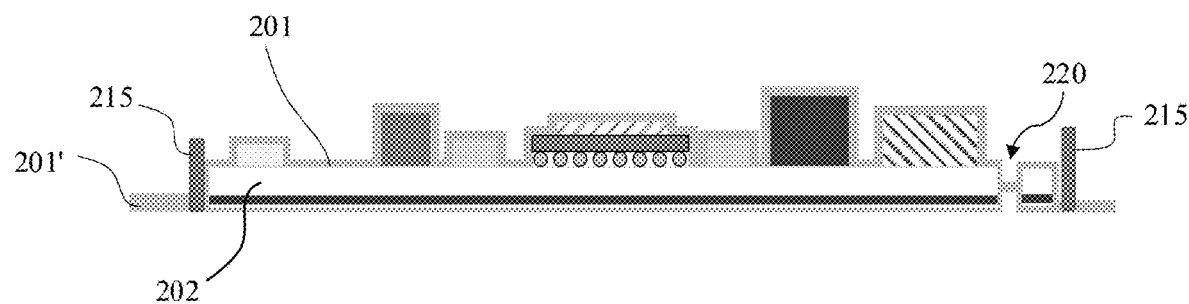

As shown in FIG. 2B, the flexible electromagnetic shield wrap 201 may be conformally positioned on the motherboard 202 according to an aspect of the present disclosure. In this aspect, the air between the flexible electromagnetic shield wrap 201 and the plurality of semiconductor devices and the top and bottom surfaces of the motherboard 202 may be removed using a vacuum apparatus (not shown). Additionally shown in 2B, the flexible electromagnetic shield wrap 201 may conformally cover the release aperture 220.

In a further aspect, a vacuum apparatus may include sealing members 215 that provide heat to fuse one or more sides of the flexible electromagnetic shield wrap 201 before and after the application of a vacuum. Any excess portions of the flexible electromagnetic shield wrap 201' may be removed. It should be understood that the apparatus needed to perform the sealing and vacuum may be a simple modification of the vacuum pack technology currently used for packing printed circuit boards.

Figure 2C:
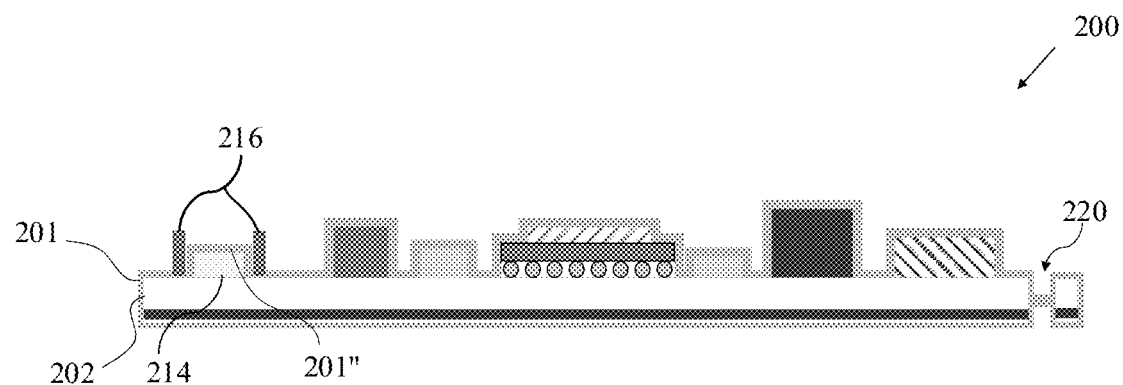
FIG. 2C shows a cross-sectional view of a wrapped exemplary motherboard in preparation for removing a portion of the conformally flexible electromagnetic shield wrap according to an aspect of the present disclosure.

In the aspect shown in FIG. 2C, the conformally wrapped motherboard 202 may have one or more portion of the flexible electromagnetic shield wrap 201 removed from atop a plug-in component 214 and similar-type components, according to an aspect of the present disclosure. In this aspect, an apparatus with thin sealing members 216 may heat a perimeter around the plug-in component 214 to permit a portion 201" of the flexible electromagnetic shield wrap to be removed. The plug-in component 214 may include USB ports, batteries, charging ports, connectors for storage module, a WIFI module, a modem, and other components.

Figure 2D:
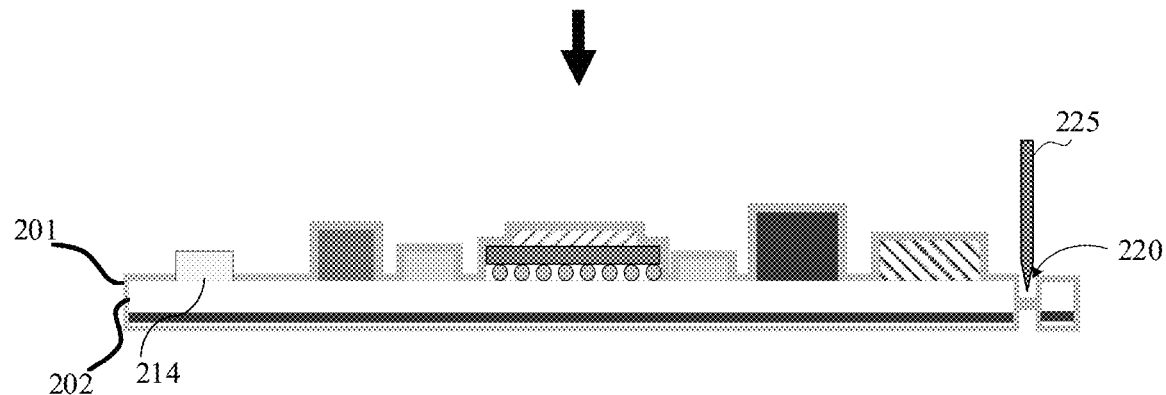
FIG. 2D shows a cross-sectional view of an exemplary motherboard in preparation for releasing its conformally positioned flexible electromagnetic shield wrap for removal according to an aspect of the present disclosure.

In an additional aspect shown in FIG. 2D, if any motherboard needs to have additional operations performed or be "reworked", a flexible electromagnetic shield wrap may be removed to permit such additional rework according to the present disclosure. In this aspect, a tool 225 may be inserted into one or more of the release aperture 220, which is pre-positioned on a motherboard, to break the vacuum seal and allow air to enter between the flexible electromagnetic shield wrap 201 and the plurality of semiconductor devices and the top and bottom surfaces of the motherboard 202.

Figure 2E:
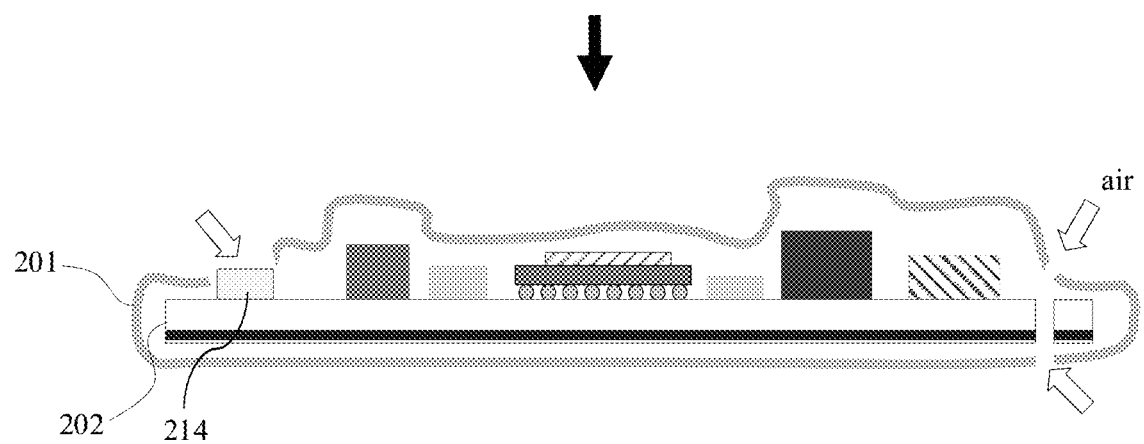
FIG. 2E shows a cross-sectional view of an exemplary motherboard with its flexible electromagnetic shield wrap no longer conformally wrapping the motherboard according to an aspect of the present disclosure

In FIG. 2E, the flexible electromagnetic shield wrap 201 is no longer conformally wrapping the motherboard 202 as shown. The flexible electromagnetic shield wrap 201 may be removed and the motherboard 202 may be reworked. Thereafter, a reworked motherboard may be wrapped again by a new flexible electromagnetic shield wrap in accordance with the present disclosure.

Figure 3A:
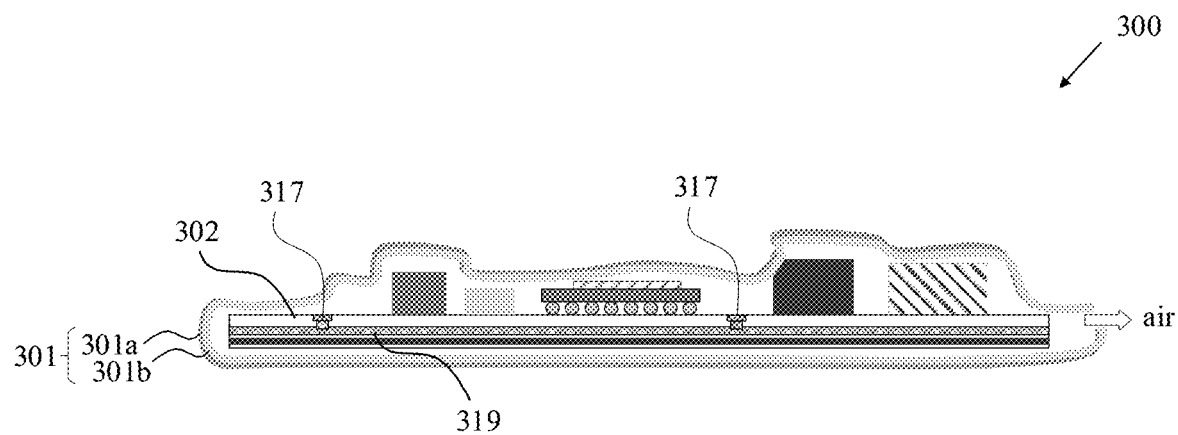
FIG. 3A shows a cross-sectional view of an exemplary motherboard enveloped in a dual-layer flexible electromagnetic shield wrap according to another aspect of the present disclosure.

According to an aspect of the present disclosure shown in FIG. 3A, a device 300 may have a motherboard 302 with a dual-layer, flexible electromagnetic shield wrap 301 conformally positioned over a plurality of semiconductor devices. In this aspect, the motherboard 302 may have one or more contact via 317 positioned at a top surface of the motherboard 302 and coupled to a ground plane 319. In addition, the flexible electromagnetic shield wrap 301 may include an outer shield layer 301a and an inner non-conductive layer 301b.

In an aspect, the outer shield layer 301a may be a thin metal layer or film or other material that can block electromagnetic energy; for example, aluminum, copper, mild steel, and shielding thermoplastics. In an aspect, the inner non-conductive layer 301b may be a softenable material that removably adheres to surfaces, such as polymer compounds and curable adhesive coatings, and may liquefy and move from a surface with the application of heat and pressure. In another aspect, the outer shield layer 301a and the inner non-conductive layer 301b may each have a thickness in the range of 15-150 um.

Figure 3B:
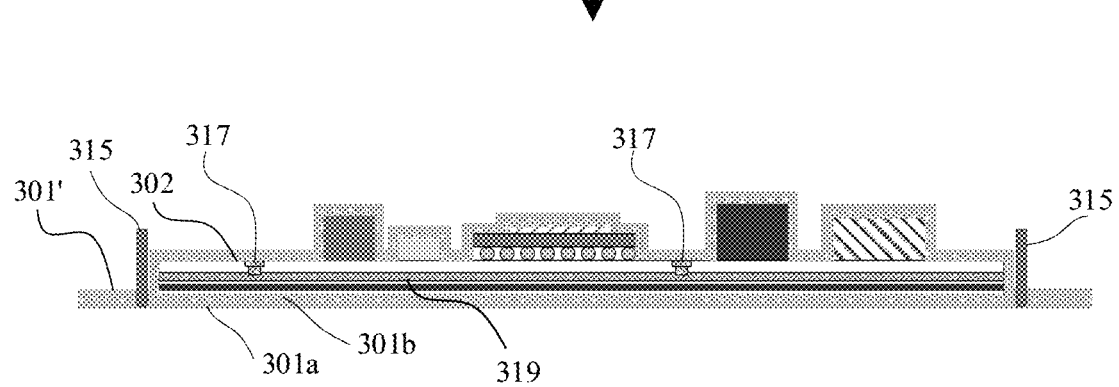
FIG. 3B shows a cross-sectional view of an exemplary motherboard with a conformally positioned dual-layer flexible electromagnetic shield wrap according to another aspect of the present disclosure.

As shown in FIG. 3B, the dual-layer, flexible electromagnetic shield wrap 301 may be conformally positioned on the motherboard 302 according to an aspect of the present disclosure. In this aspect, the air between the flexible electromagnetic shield wrap 301 and the plurality of semiconductor devices and the top and bottom surfaces of the motherboard 302 may be removed by way of a vacuum apparatus (not shown). The inner non-conductive layer 301b may provide additional adhesion for the flexible electromagnetic shield wrap 301 to remain conformally positioned on the plurality of semiconductor devices and the top and bottom surfaces of the motherboard 202.

In a further aspect, a vacuum apparatus may include sealing members 315 that provides heat to fuse one or more sides of the flexible electromagnetic shield wrap 301 before or simultaneously with the application of the vacuum. Any excess portions of the flexible electromagnetic shield wrap 301' may be removed.

Figure 3C:
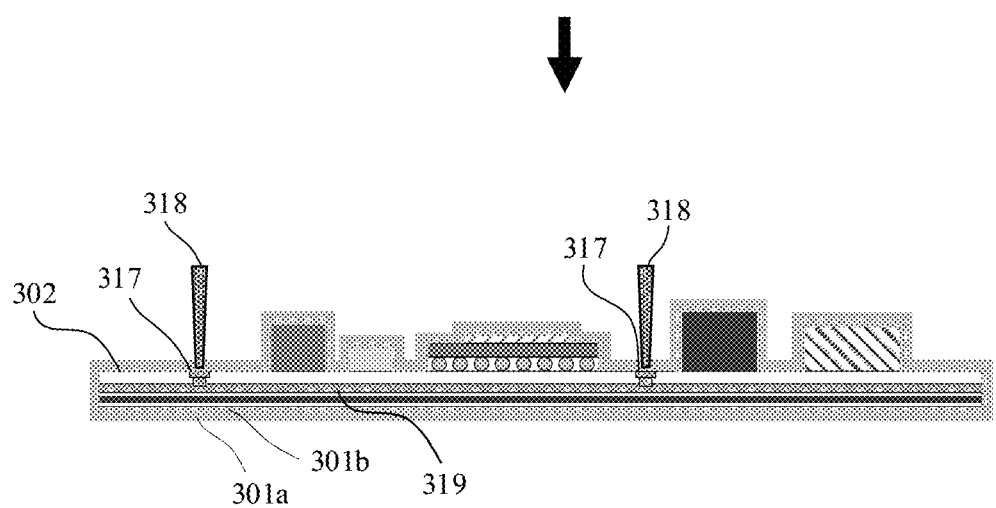
FIG. 3C shows a cross-sectional view of an exemplary motherboard with a conformally positioned dual-layer flexible electromagnetic shield wrap in preparation for coupling the shield wrap to a ground layer in the motherboard according to another aspect of the present disclosure.

FIG. 3C shows a cross-sectional view of the motherboard 302 with a conformally positioned dual-layer flexible electromagnetic shield wrap 301 being prepared for coupling to the ground layer 319 in the motherboard according to another aspect of the present disclosure. In this aspect, a tool 318 may be used to apply heat and pressure to the flexible electromagnetic shield wrap 301 above the contact vias 317 to connect the outer shield layer 301a to the contact via 317 and couple it to the ground plane 319.

Figure 3D:
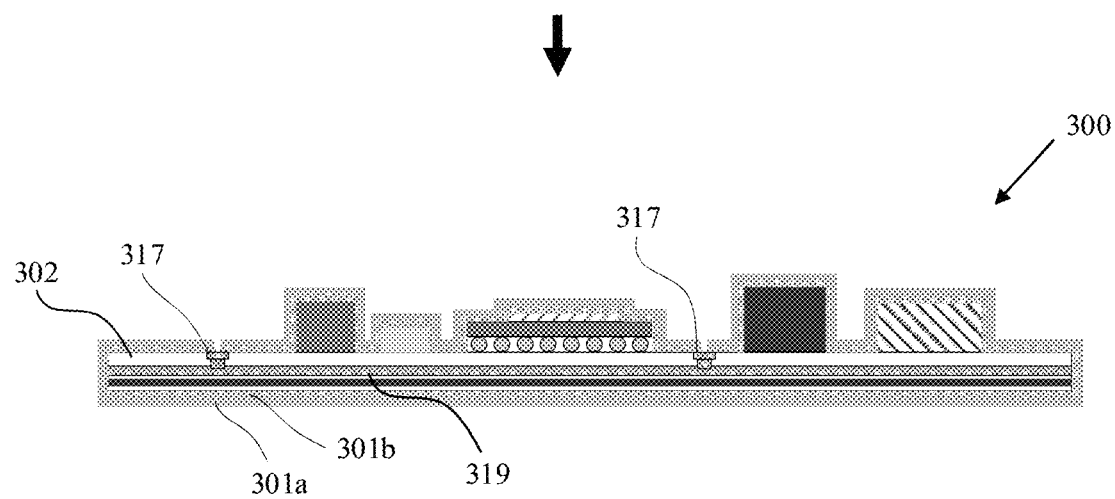
FIG. 3D shows a cross-sectional view of an exemplary motherboard with a conformally positioned dual-layer flexible electromagnetic shield wrap coupled to a ground layer in the motherboard according to another aspect of the present disclosure.

FIG. 3D shows a cross-sectional view of the device 300 that has the motherboard 302 with a conformally positioned dual-layer and the flexible electromagnetic shield wrap 301 coupled to the ground layer 319 in the motherboard according to an aspect of the present disclosure.

Figure 4:
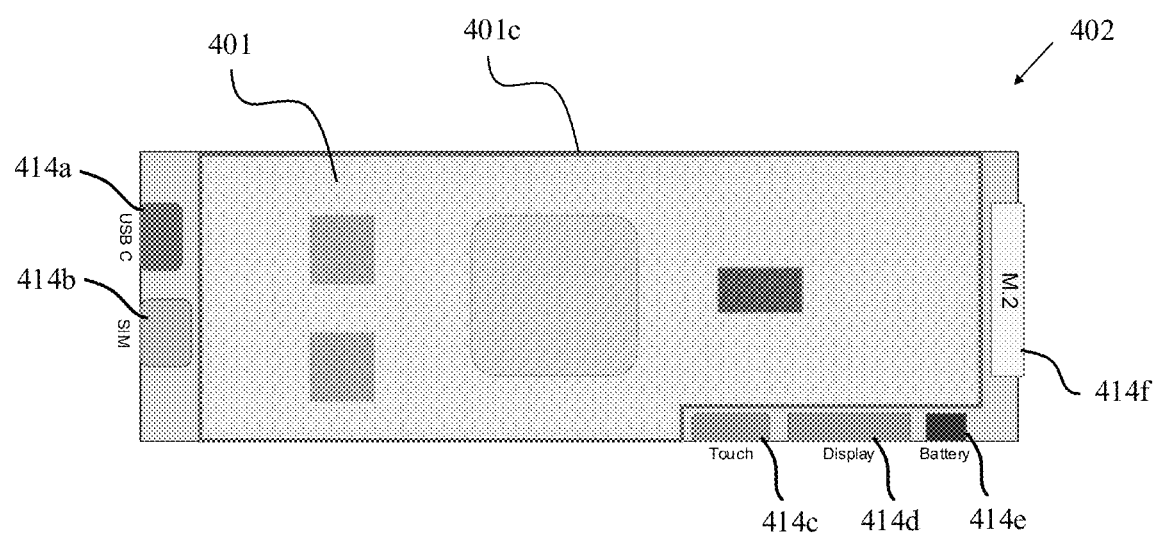
FIG. 4 shows a top view of an exemplary motherboard with a conformally positioned flexible electromagnetic shield wrap according to an aspect of the present disclosure.

FIG. 4 shows a top view of an exemplary motherboard 402 with a conformally positioned flexible electromagnetic shield wrap 401 according to an aspect of the present disclosure. The flexible electromagnetic shield wrap 401 may be vacuum sealed on a top surface of the motherboard 402 along a thin seal landing 401c on the top surface. Although not shown, the motherboard 402 may have a flexible electromagnetic shield wrap on its bottom surface that is similarly sealed. This aspect may allow either surface of a motherboard to be independently covered and/or uncovered. As shown in this aspect, a plurality of representative plug-in components 414a through 414f may be uncovered by the flexible electromagnetic shield wrap 401.

Figure 5A:
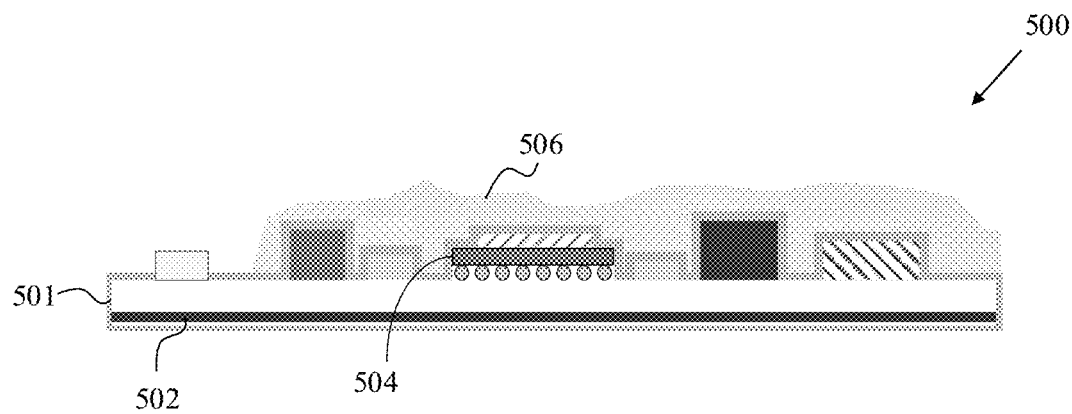
FIG. 5A shows a cross-sectional view of an exemplary motherboard with a conformally positioned flexible electromagnetic shield wrap in preparation for coupling with a thermal solution according to yet another aspect of the present disclosure.

FIG. 5A shows a cross-sectional view of a device 500 with a motherboard 502 with a conformally positioned flexible electromagnetic shield wrap 501 covered with a thermal interface material (TIM) 506, which is part of a thermal transfer unit, to dissipate heat from the device 500 according to yet another aspect of the present disclosure. At a minimum, the TIM 506 may cover a semiconductor package 504 since it will generate the most heat. A plurality of other components may also be covered by the TIM 506 as shown in this aspect. The TIM 506 may be a thermally conductive material, including polymer TIMs, thermal gap fillers, thermal pastes, thermal greases, and waxes. In an aspect, a TIM may be flexible so that it may be removed together with a released flexible electromagnetic shield wrap.

Figure 5B:
FIG. 5B shows a cross-sectional view of an exemplary motherboard with a conformally positioned flexible electromagnetic shield wrap in preparation for coupling with a thermal solution according to yet another aspect of the present disclosure.
Figure 5B:
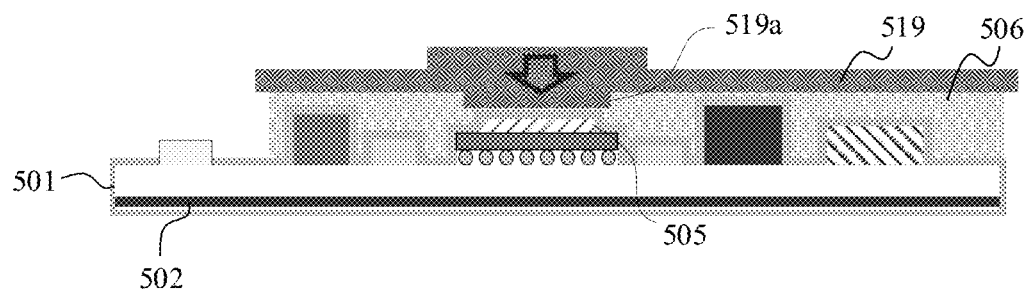

In FIG. 5B, in a further aspect, a tool press 519 may apply pressure to shape (i.e., level) the TIM 506, and the tool press 519 may include an extension 519a, which creates a recess above the semiconductor die 505.

Figure 5C:
FIG. 5C shows a cross-sectional view of an exemplary motherboard with a conformally positioned flexible electromagnetic shield wrap that is coupled with a thermal solution according to yet another aspect of the present disclosure.
Figure 5C:
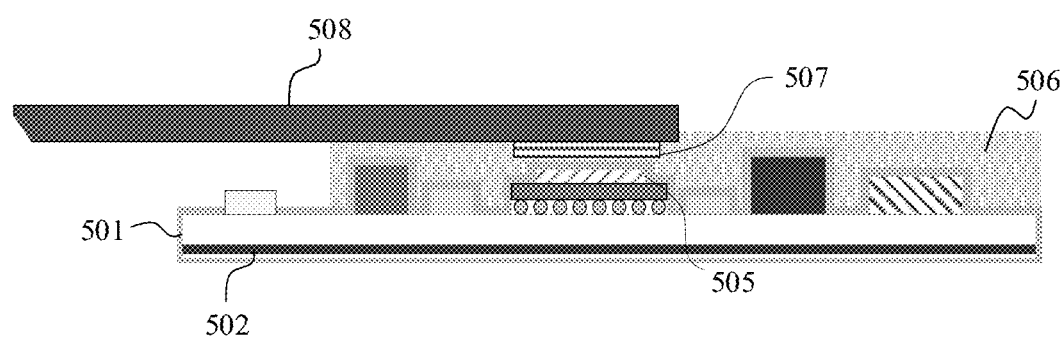

FIG. 5C shows the device 600 including a heat spreader 507 placed in the recess formed by extension 519a above the semiconductor die 505, and a heat pipe 508 attached to the heat spreader 507 according to yet a further aspect of the present disclosure. The TIM 506, the heat spreader 507, and the heat pipe 508 act as a thermal transfer unit to dissipate heat from the plurality of semiconductor devices on the motherboard 502.

Figure 6:
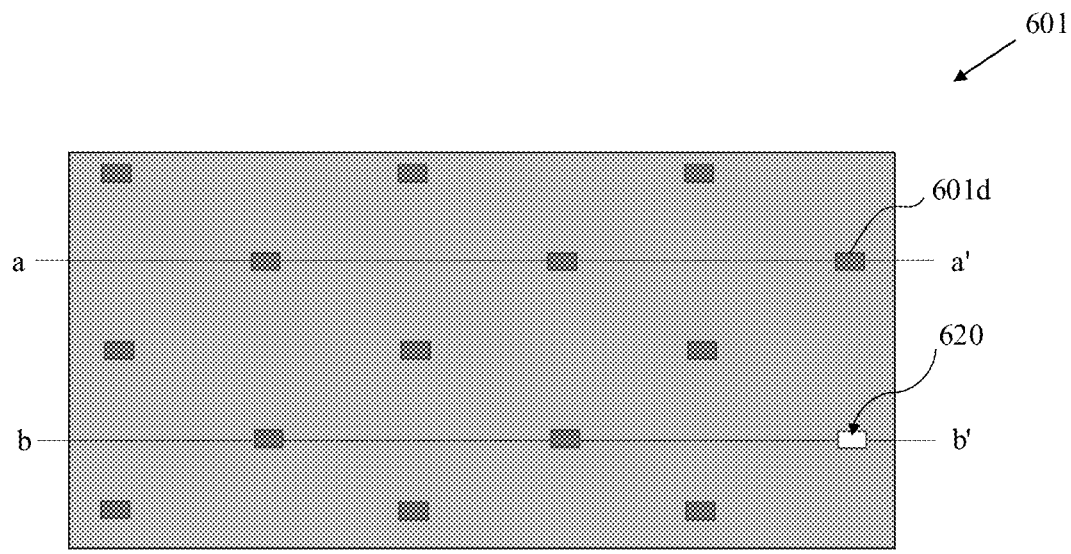
FIGS. 6, 6A, and 6B show views of an aspect of an exemplary flexible electromagnetic shield wrap according to the present disclosure.

FIG. 6 shows a top view of an aspect of a dual-layer, flexible electromagnetic shield wrap 601 according to the present disclosure. The flexible electromagnetic shield wrap 601 may have a plurality of removable release members 601d positioned in a shield wrap. In another aspect, the plurality of removable release members 601d may be peel-away stickers (not shown) positioned on a shield wrap. The release members 601d may be removed to rupture the vacuum seal and allow air to enter an opening 620, the air refilling spaces between a flexible electromagnetic shield wrap and a plurality of semiconductor devices and top and bottom surfaces of a motherboard.

Figure 6A:
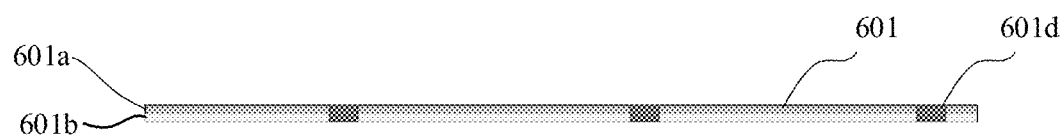
Figure 6B:
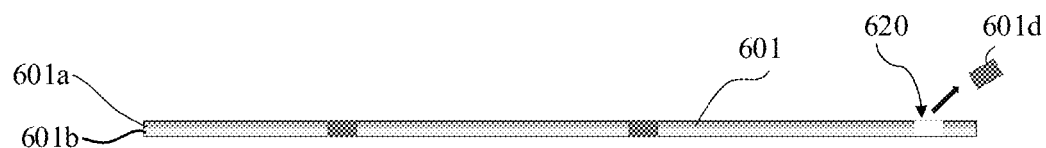

In FIG. 6A, the flexible electromagnetic shield wrap 601 is shown as a cross-section taken along an a-a' section line; while in FIG. 6B, a cross-section of the flexible electromagnetic shield wrap 601 is shown along a b-b' section line. In both FIGS. 6A and 6B, the flexible electromagnetic shield wrap 601 may include an outer shield layer 601a and inner non-conductive layer 601b. The outer shield layer 601a may be a thin metal film or other material that can block electromagnetic energy, as described above. The inner non-conductive layer 601b may be a softenable material that removably adheres to surfaces, as also described above.

Figure 7:
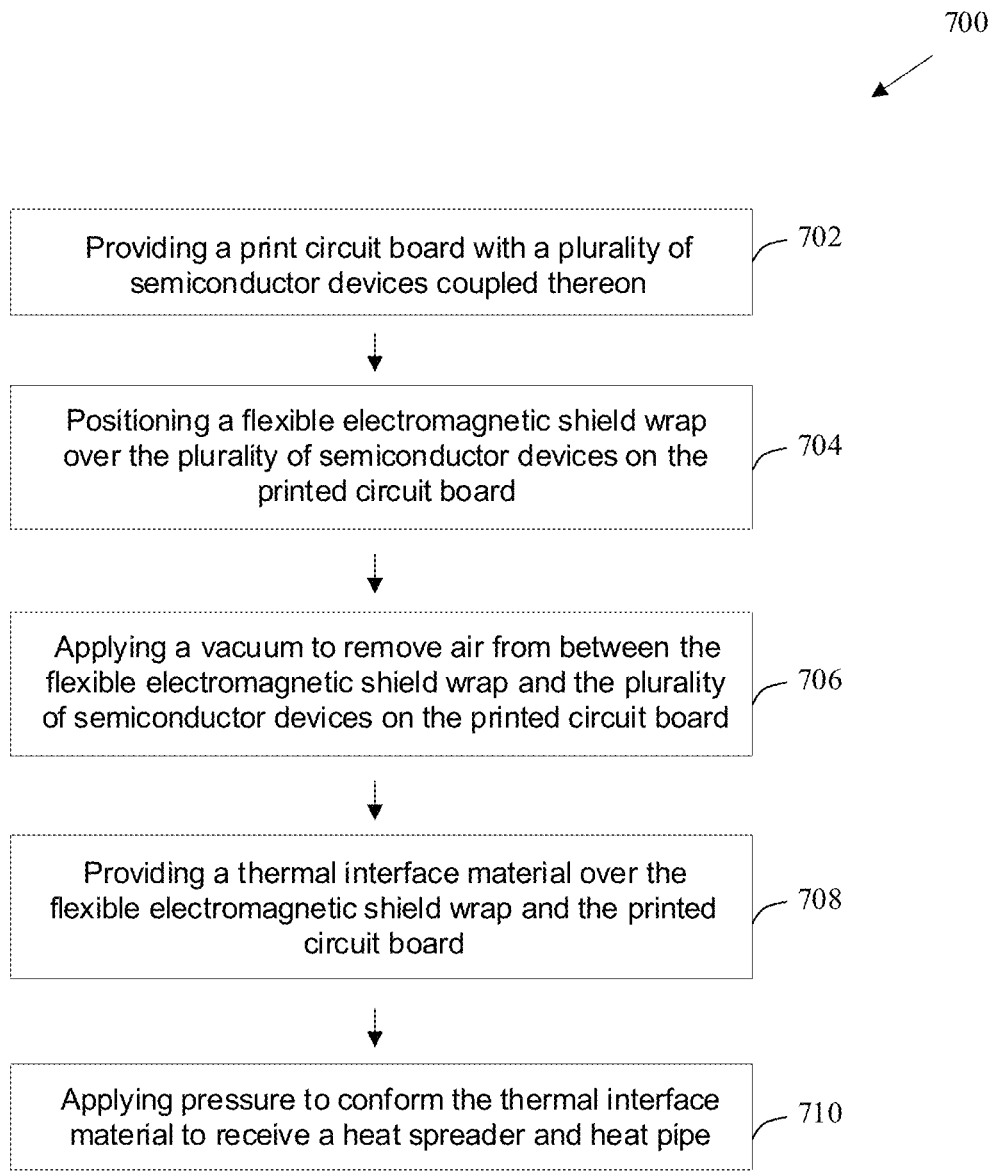
FIG. 7 shows a simplified flow diagram for an exemplary method according to an aspect of the present disclosure.

FIG. 7 shows a simplified flow diagram for an exemplary method according to aspects of the present disclosure encompassing the assembly process for a present device.

The operation 702 may be directed to providing a print circuit board with a plurality of semiconductor devices coupled thereon.

The operation 704 may be directed to positioning a flexible electromagnetic shield wrap over and between the plurality of semiconductor devices on the printed circuit board.

The operation 706 may be directed to applying a vacuum to remove air from between the flexible electromagnetic shield wrap and the plurality of semiconductor devices on the printed circuit board.

The operation 708 may be directed to providing a thermal interface material over the flexible electromagnetic shield wrap and the printed circuit board.

The operation 710 may be directed to applying pressure to conform the thermal interface material to receive a heat spreader and heat pipe.

Figure 8:
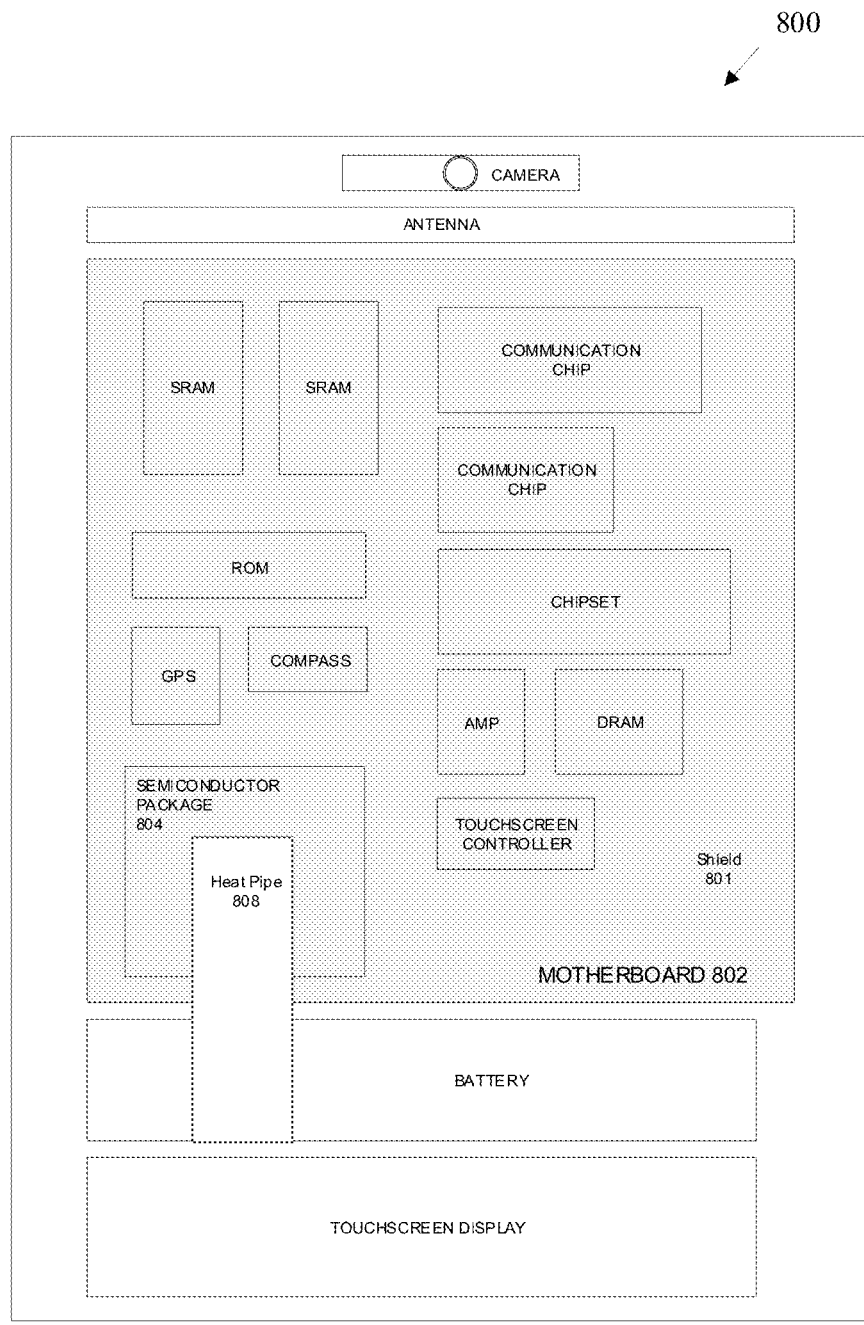
FIG. 8 shows an exemplary computing device according to an aspect of the present disclosure.

FIG. 8 shows an exemplary computing device 800 having a motherboard 802 with a plurality of semiconductor components, including a semiconductor package 804, which are covered by a flexible electromagnetic shield wrap 801, and a thermal transfer unit, including a heat pipe 808 according to various aspects of the present disclosure. In various implementations, the computing device 800 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 800 may be a mobile computing device. In further implementations, the computing device 800 may be any other electronic device that processes data.

In a further aspect, the computing device 800 may have a board, such as a motherboard, having several components, including, but not limited to, a semiconductor processor that may or may not be physically and electrically coupled to such motherboard. The other components may include, but are not limited to, volatile memory (e.g., DRAM), non-volatile memory (e.g., ROM), flash memory, a graphics processor, a digital signal processor, a crypto-processor, a communication chip, a chipset, an antenna, a display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). It is within the scope of the present disclosure to use, for example, one or more horizontal inductors in other components set forth above.

According to the present disclosure, a computing device 800 using a flexible electromagnetic shield wrap 801 may include a plurality of communication chips. The communication chips may also operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip may operate in accordance with other wireless protocols in other aspects. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

In another aspect, the communication chip may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not.

The communication chip may implement any of several wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

To more readily understand and put into practical effect the present method and device for, particular aspects will now be described by way of examples. For the sake of brevity, duplicate descriptions of features and properties may be omitted.

EXAMPLES

Example 1 may include a device having a printed circuit board including a top surface and a bottom surface, a plurality of semiconductor devices coupled to the top surface of the printed circuit board, and a flexible electromagnetic shield wrap conformally positioned over and between the plurality of semiconductor devices and on the top surface of the printed circuit board.

Example 2 may include the device of example 1 and/or any other example disclosed herein, in which the flexible electromagnetic shield wrap is conformally positioned by applying a vacuum.

Example 3 may include the device of example 1 and/or any other example disclosed herein, in which the flexible electromagnetic shield wrap is removable.

Example 4 may include the device of example 1 and/or any other example disclosed herein, in which the flexible electromagnetic shield wrap further includes a shield layer including an electromagnetic energy blocking material and a non-conductive layer including a softenable material that removably adheres to surfaces.

Example 5 may include the device of example 1 and/or any other example disclosed herein, in which the flexible electromagnetic shield wrap further includes a sheet-shaped format or an envelope-shaped format.

Example 6 may include the device of example 1 and/or any other example disclosed herein, in which the flexible electromagnetic shield wrap further includes one or more removable release members.

Example 7 may include the device of example 1 and/or any other example disclosed herein, in which the printed device further includes one or more release aperture, wherein the release aperture is covered by the flexible electromagnetic shield wrap.

Example 8 may include the device of example 1 and/or any other example disclosed herein, further including a thermal interface material conformally positioned over the flexible electromagnetic shield wrap.

Example 9 may include the device of example 8 and/or any other example disclosed herein, further including a heat spreader and a heat pipe attached to the thermal interface material.

Example 10 may include the device of example 1 and/or any other example disclosed herein, further including the flexible electromagnetic shield wrap conformally positioned over the bottom surface of the printed circuit board.

Example 11 may include the device of example 10 and/or any other example disclosed herein, in which the printed circuit board further includes a signal routing layer proximal to the bottom surface of the printed circuit board.

Example 12 may include the device of example 4 and/or any other example disclosed herein, in which the printed circuit board further includes contact vias on the top surface of the printed circuit board connected to a ground layer therein, in which the device further includes the shield layer coupled to the contact vias.

Example 13 may include the device of example 1 and/or any other example disclosed herein, in which the printed circuit board further includes a plurality of plug-in components, wherein the plug-in components are uncovered by the flexible electromagnetic shield wrap.

Example 14 may include computing device including a printed circuit board including a top surface and a bottom surface, a plurality of semiconductor devices coupled to the top surface of the printed circuit board, and a flexible electromagnetic shield wrap conformally positioned over and between the plurality of semiconductor devices and on the top surface of the printed circuit board.

Example 15 may include the computing device of example 14 and/or any other example disclosed herein, in which the flexible electromagnetic shield wrap is conformally positioned by applying a vacuum.

Example 16 may include the computing device of example 14 and/or any other example disclosed herein, further including a thermal transfer unit conformally positioned over the flexible electromagnetic shield wrap.

Example 17 may include a method including providing a printed circuit board including a top surface and a bottom surface, coupling a plurality of semiconductor devices to the top surface of the printed circuit board, positioning a flexible electromagnetic shield wrap over the plurality of semiconductor devices on the printed circuit board, applying a vacuum to remove air between the flexible electromagnetic shield wrap and the plurality of semiconductor devices on the printed circuit board to conformally adhere the flexible electromagnetic shield wrap onto and between the plurality of semiconductor devices and onto the top and bottom surfaces of the printed circuit board.

Example 18 may include the method of example 17 and/or any other example disclosed herein, further including providing a thermal interface material over the flexible electromagnetic shield wrap and the printed circuit board and applying pressure with a tool to conform the thermal interface material to a receive a heat spreader and heat pipe.

Example 19 may include the method of example 17 and/or any other example disclosed herein, further including applying heat to selected locations of the flexible electromagnetic shield wrap to seal in the vacuum or connect the flexible electromagnetic shield wrap to a surface.

Example 20 may include the method of example 19 and/or any other example disclosed herein, further including releasing the vacuum to perform additional operations on the printed circuit board, wherein releasing the vacuum further includes one of providing the flexible electromagnetic shield wrap with one or more release members and removing one or more of the release members, or providing the printed circuit board with one or more release apertures covered by the flexible electromagnetic shield wrap and inserting a tool into one or more of the release apertures to puncture the flexible electromagnetic shield wrap.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled, as thermally coupled, or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
   a printed circuit board comprising a top surface and a bottom surface;
   a plurality of semiconductor devices coupled to the top surface of the printed circuit board; and
   a flexible electromagnetic shield wrap conformally positioned over and between the plurality of semiconductor devices and on the top surface, the bottom surface, and a side surface of the printed circuit board;
   further comprising an opening between the top surface and the bottom surface of the printed circuit board, wherein within the opening a portion of the flexible electromagnetic shield wrap covering the top surface is in contact with another portion of the flexible electromagnetic shield wrap covering the bottom surface.

2. The device of claim 1, wherein the flexible electromagnetic shield wrap is conformally positioned by applying a vacuum.

3. The device of claim 1, wherein the flexible electromagnetic shield wrap is removable from a surface on which it is applied.

4. The device of claim 1, wherein the flexible electromagnetic shield wrap further comprises: a shield layer comprising an electromagnetic energy blocking material; and a non-conductive layer comprising a softenable material that removably adheres to surfaces.

5. The device of claim 4, wherein the printed circuit board further comprises contact vias on the top surface of the printed circuit board connected to a ground layer therein, wherein the device further comprises the shield layer coupled to the contact vias.

6. The device of claim 1, wherein the flexible electromagnetic shield wrap further comprises a sheet-shaped format or an envelope-shaped format.

7. The device of claim 1, wherein the flexible electromagnetic shield wrap further comprises one or more removable release members.

8. The device of claim 1, wherein the printed circuit board further comprises one or more release aperture, wherein the release aperture is covered by the flexible electromagnetic shield wrap.

9. The device of claim 1, further comprising a thermal interface material conformally positioned over the flexible electromagnetic shield wrap.

10. The device of claim 9, further comprising a heat spreader and a heat pipe attached to the thermal interface material.

11. The device of claim 1, further comprising the flexible electromagnetic shield wrap conformally positioned over the bottom surface of the printed circuit board.

12. The device of claim 11, wherein the printed circuit board further comprises a signal routing layer proximal to the bottom surface of the printed circuit board.

13. The device of claim 1, wherein the printed circuit board further comprises a plurality of plug-in components, wherein the plug-in components are uncovered by the flexible electromagnetic shield wrap.

14. The device of claim 1, wherein the flexible electromagnetic shield wrap is configured to create an air-tight seal around the opening and to maintain a vacuum or a partial vacuum within the opening, relative to atmosphere.

15. The device of claim 14, wherein the flexible electromagnetic shield wrap is configured to be removable from the printed circuit board and the plurality of semiconductor devices when the air-tight seal around the opening is broken.

\* \* \* \* \*